United States Patent
Yamagishi et al.

(10) Patent No.: US 9,832,872 B2
(45) Date of Patent: Nov. 28, 2017

(54) METHOD FOR MANUFACTURING ELECTRONIC DEVICE, AND ELECTRONIC DEVICE

(71) Applicant: DENSO CORPORATION, Kariya, Aichi-pref. (JP)

(72) Inventors: Tetsuto Yamagishi, Kariya (JP); Masayuki Takenaka, Kariya (JP); Toshihiro Nagaya, Kariya (JP); Shinji Hiramitsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/318,695

(22) PCT Filed: Sep. 14, 2015

(86) PCT No.: PCT/JP2015/004655
§ 371 (c)(1),
(2) Date: Dec. 14, 2016

(87) PCT Pub. No.: WO2016/047083
PCT Pub. Date: Mar. 31, 2016

(65) Prior Publication Data
US 2017/0135210 A1 May 11, 2017

(30) Foreign Application Priority Data
Sep. 22, 2014 (JP) ................................. 2014-192746

(51) Int. Cl.
*H05K 1/00* (2006.01)
*H05K 1/11* (2006.01)
(Continued)

(52) U.S. Cl.
CPC .............. *H05K 1/115* (2013.01); *B29C 43/18* (2013.01); *B29C 70/78* (2013.01); *H01L 21/565* (2013.01);
(Continued)

(58) Field of Classification Search
CPC ...... H05K 5/0034; H05K 5/065; H05K 3/284; H05K 2201/10977; H05K 2203/1316;
(Continued)

(56) References Cited

U.S. PATENT DOCUMENTS 5,044,912 A * 9/1991 Billings ............ B29C 45/14065
257/E21.504
5,295,299 A * 3/1994 Takahashi ................ H05K 3/44
174/262

(Continued)

FOREIGN PATENT DOCUMENTS

JP   S62-254483 A   11/1987
JP   3646665 B2     2/2005

(Continued)

*Primary Examiner* — Chau N Nguyen
*Assistant Examiner* — Roshn Varghese
(74) *Attorney, Agent, or Firm* — Posz Law Group, PLC

(57) ABSTRACT

A manufacturing method of an electronic device, including: a circuit board with a substrate through hole; a circuit element; and a resin mold with a mold through hole, using a first mold, a second mold having a cavity, and a pressing member protruding from a bottom of the cavity includes: fixing the circuit board to the first mold; fixing the second mold to the first mold to cover an opening of the substrate through hole by the pressing member; and forming the resin mold while covering the circuit element with the constituent material in the cavity. The circuit board is deformed by press-contacting the pressing member to the circuit board in a state where a part of the pressing member is inserted into the substrate through hole so that an opening area of the substrate through hole decreases toward a reverse surface from the one surface.

10 Claims, 14 Drawing Sheets

(51) Int. Cl.
*B29C 43/18* (2006.01)
*H05K 3/28* (2006.01)
*B29C 70/78* (2006.01)
*H05K 1/18* (2006.01)
*H01L 21/56* (2006.01)
*B29C 70/88* (2006.01)
*B29L 31/34* (2006.01)
*H01L 23/31* (2006.01)

(52) U.S. Cl.
CPC ............... *H05K 1/181* (2013.01); *H05K 3/28* (2013.01); *B29C 70/88* (2013.01); *B29L 2031/3425* (2013.01); *H01L 23/3121* (2013.01); *H01L 2924/0002* (2013.01)

(58) Field of Classification Search
CPC ... H05K 2203/1322; H05K 2203/1327; H05K 2203/1476; H01L 23/3121; H01L 23/4334; H01L 23/10; H01L 23/3107; H01L 21/56; H01L 21/565; Y10T 29/49158; B29C 2045/14147
USPC ......................................................... 174/252
See application file for complete search history.

(56) References Cited

U.S. PATENT DOCUMENTS

| | | | | |
|---|---|---|---|---|
| 5,427,938 | A * | 6/1995 | Matsumura | B29C 45/14655 257/E21.504 |
| 7,495,324 | B2 * | 2/2009 | Popp | H01L 25/16 257/678 |
| 7,839,004 | B2 * | 11/2010 | Sakai | B29C 45/0046 257/666 |
| 8,258,622 | B2 * | 9/2012 | Lee | H01L 21/565 257/706 |
| 2004/0090753 | A1 * | 5/2004 | Nakagawa | H01L 23/3107 361/752 |
| 2012/0086003 | A1 * | 4/2012 | Park | H01L 21/56 257/48 |
| 2015/0086666 | A1 * | 3/2015 | Terui | B29C 45/14065 425/116 |

FOREIGN PATENT DOCUMENTS

| | | |
|---|---|---|
| JP | 2008-198661 A | 8/2008 |
| JP | 2014-150128 A | 8/2014 |
| JP | 2016-082169 A | 5/2016 |
| WO | 2016/098332 A1 | 6/2016 |

\* cited by examiner

METHOD FOR MANUFACTURING ELECTRONIC DEVICE, AND ELECTRONIC DEVICE

CROSS REFERENCE TO RELATED APPLICATIONS

This application is a U.S. national stage of International Patent Application No. PCT/JP2015/004655 filed on Sep. 14, 2015 and is based on Japanese Patent Application No. 2014-192746 filed on Sep. 22, 2014, the disclosures of which are incorporated herein by reference.

TECHNICAL FIELD

The present disclosure relates to a method for manufacturing an electronic device, and an electronic device.

BACKGROUND ART

In the related art, a component mounting substrate is disclosed in Patent Literature 1 as an example of an electronic device. This component mounting substrate is configured to have a substrate that is made up of multiple conductive plates, an internal electrical component that is electrically connected to the substrate, and a resinous sealing portion that seals the substrate and the internal electrical component. In addition, in the component mounting substrate, an opening portion is provided in the sealing portion and a terminal hole positioned in the opening portion is provided in the substrate.

In the component mounting substrate, the sealing portion is disposed in a state where a surface of the substrate in a vicinity of the terminal hole is exposed. It is conceivable that the sealing portion is molded with the terminal hole in the substrate being blocked in this component mounting substrate in a case where the sealing portion is disposed with respect to the substrate. In other words, the component mounting substrate can be manufactured by the sealing portion being molded with the terminal hole being blocked by a pressing member coming into contact with the surface of the substrate so that penetration of the terminal hole by resin constituting the sealing portion is restricted. At this time, a large contact area is required between the pressing member and the substrate for the resin not to leak out from a space between the pressing member and the substrate. Accordingly, the component mounting substrate might cause an increase in planar-direction size equivalent to a region in the surface of the substrate in contact with the pressing member.

PRIOR ART LITERATURES

Patent Literature

Patent Literature 1: Japanese Patent No. 3740329

SUMMARY OF INVENTION

It is an object of the present disclosure to provide a method for manufacturing an electronic device by which an increase in size can be restricted. Another object of the present disclosure is to provide an electronic device that is compact in size.

According to a first aspect of the present disclosure, a method for manufacturing an electronic device including: a circuit board in which a wiring is arranged on a resin base; a circuit element mounted on one surface of the circuit board; a resin mold disposed on the one surface of the circuit board and sealing the circuit element; a substrate through hole penetrating the circuit board in a thickness direction; and a mold through hole communicating with the substrate through hole and penetrating the resin mold in the thickness direction, the method for manufacturing the electronic device using: a first mold to which the circuit board is fixed; a second mold having a recessed cavity in which a constituent material of the resin mold is arranged; and a pressing member disposed to protrude from a bottom surface of the recessed cavity and pressing the circuit board, the method for manufacturing the electronic device includes: fixing the circuit board, on which the circuit element is mounted, to the first mold; covering an opening of the substrate through hole on the one surface by pressing the pressing member against the circuit board from the one surface; and forming the resin mold by hardening the constituent material while covering the one surface and the circuit element with the constituent material in the recessed cavity in a state where the second mold is fixed to the one surface or the first mold in such a manner that the recessed cavity faces the one surface, and the opening is covered by the pressing member to seal the recessed cavity. The covering of the opening includes press-contacting the pressing member to the circuit board in a state where a part of the pressing member is inserted into the substrate through hole, and the opening is covered in a state where the circuit board is deformed to have a tilted shape in such a manner that an opening area of the substrate through hole decreases toward a reverse surface from an open end on the one surface.

According to the method for manufacturing an electronic device described above, a molding process is performed in a state where the pressing member is disposed to protrude from a bottom surface of the second mold and the pressing member is inserted into the substrate through hole, and thus an electronic device can be manufactured that has the mold resin in which the mold through hole is provided.

In addition, the substrate through hole is blocked by the pressing member in the method for manufacturing an electronic device described above, and thus penetration of the substrate through hole by the constituent material can be restricted. Furthermore, in the method for manufacturing an electronic device described above, the molding is performed in a state where the pressing member is pressed against the circuit board so that the circuit board is deformed, and thus penetration of the substrate through hole by the constituent material can be further restricted.

The pressing member is in contact with a part of the circuit board that is deformed to be inclined. In other words, the substrate through hole is sealed by the pressing member coming into close contact with the part that is deformed to be inclined. Therefore, in the method for manufacturing an electronic device described above, at least a part of a seal surface for restricting penetration of the substrate through hole by the constituent material can be inclined. Since at least a part of the seal surface can be inclined as described above by the method for manufacturing an electronic device described above, the electronic device can be manufactured with an increase in planar-direction size being restricted even in a case where a seal surface equal in area to that seal surface is provided on one surface of the circuit board.

According to a second aspect of the present disclosure, an electronic device includes: a circuit board in which a wiring is arranged on a resin base; a circuit element mounted on one surface of the circuit board; and a resin mold disposed on the one surface of the circuit board and sealing the circuit element. The circuit board includes: a substrate through hole penetrating the circuit board in a thickness direction of the circuit board; and a substrate inclined portion having a tilted shape that an opening area of the substrate through hole decreases toward a reverse surface from an open end on the one surface, the reverse surface being opposite to the one surface. The resin mold includes a mold through hole penetrating the resin mold in a thickness direction of the resin mold and communicating with the substrate through hole. The substrate inclined portion is a deformation portion deformed by a pressing member for covering the substrate through hole and for providing the mold through hole in a resin mold formation.

In the electronic device described above, the substrate inclined portion is a portion deformed by the pressing member blocking the substrate through hole while providing the mold through hole during the molding of the mold resin. Accordingly, a surface of the substrate inclined portion is a seal surface. Therefore, the electronic device described above can become compact in planar-direction size even in a case where a seal surface equal in area to that seal surface is provided on one surface of the circuit board.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
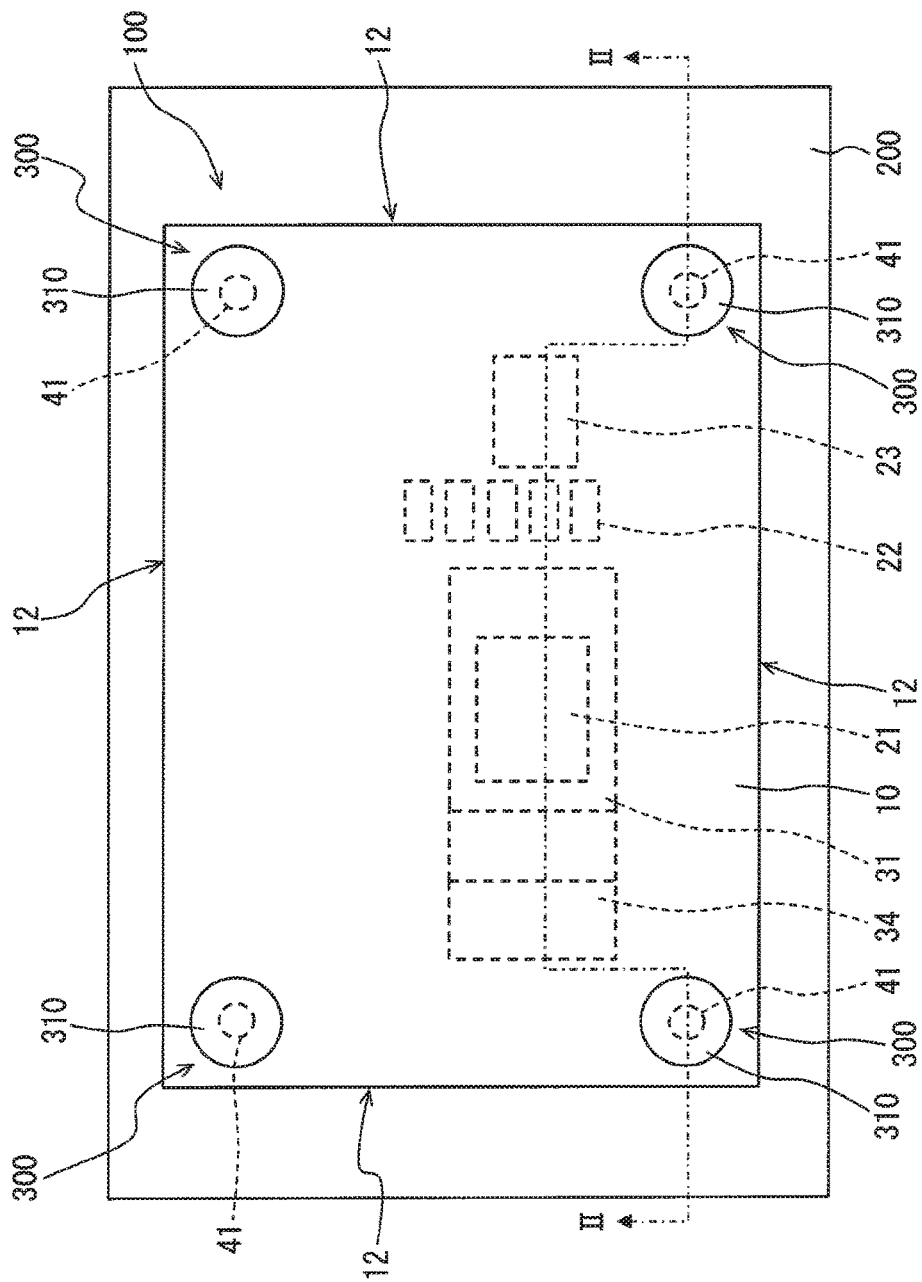
FIG. 1 is a top view illustrating a schematic configuration of an electronic device according to an embodiment.

Hereinafter, multiple forms for carrying out the disclosure will be described with reference to accompanying drawings. The same reference numerals will be used to refer to parts common to two or more of the forms so that repetition of the same description is avoided if necessary. In the case of only partial description of configuration in each of the forms, previous description can be referred to for application when it comes to the rest without description.

Figure 2:
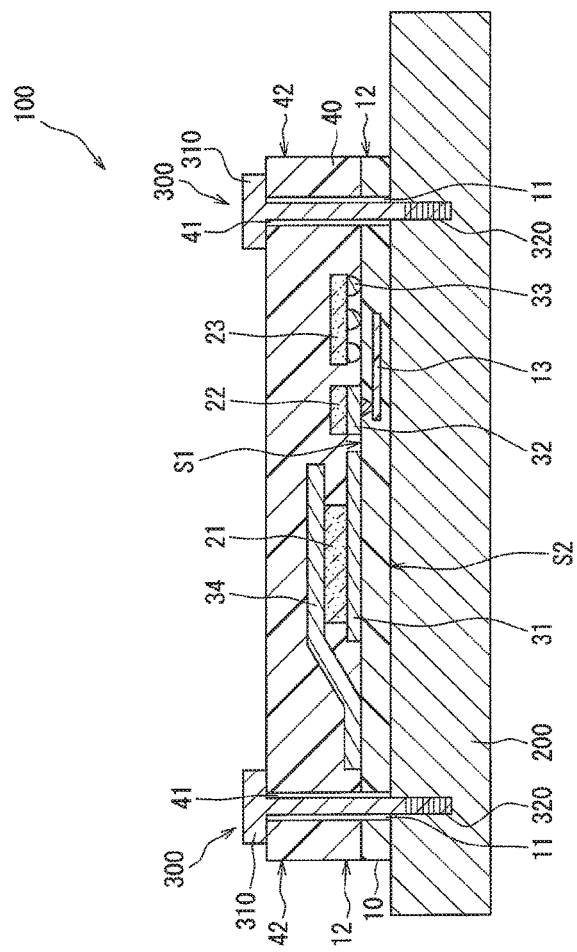
FIG. 2 is a cross-sectional view taken along line II-II in FIG. 1.

In the present embodiment, an example is adopted in which an electronic device according to the present disclosure is applied to an electronic device 100 that is illustrated in FIG. 1 and so on. As illustrated in FIG. 2, the electronic device 100 is configured to have a circuit board 10, a heat generating element 21 as a circuit element that is mounted on one surface S1 of the circuit board 10, and a mold resin 40 that is disposed on the surface S1 of the circuit board 10 and seals the heat generating element 21. In the present embodiment, an example in which the electronic device 100 is applied to a vehicle electronic device that is mounted in an engine room of a vehicle is adopted as an example. The electronic device 100 can also be applied to an inverter device as an example of the vehicle electronic device. The electronic device 100 can be applied to devices other than the vehicle electronic device as well.

In the electronic device 100, in-mold elements 22 and 23 may be mounted, in addition to the heat generating element 21, on the surface S1 of the circuit board 10 via a solder 32 and a solder 33 and sealed by the mold resin 40 as illustrated in FIG. 2. The in-mold elements 22 and 23 are circuit elements such as chip capacitors and diodes. In a case where the electronic device 100 is applied to the inverter device, the electronic device 100 may have the heat generating element 21 and the in-mold elements 22 and 23 in the mold resin 40 as some of circuit elements constituting an inverter.

The circuit board 10 is a circuit board in which wiring 13 formed of a conductive member is provided in an insulating resin base material. For example, a so-called build-up substrate that includes a core layer and a build-up layer stacked on the core layer can be adopted as the circuit board 10. A so-called any-layer substrate, in which multiple build-up layers are stacked without any core layer, can also be adopted as the circuit board 10. A land is disposed on the surface S1 of the circuit board 10 and the heat generating element 21, the in-mold elements 22 and 23, and so on are mounted on the land. This land is electrically connected to the wiring 13. In this manner, the circuit board 10 can be called a printed board.

The circuit board 10 has the shape of, for example, a rectangular parallelepiped. In other words, the surface S1 and a reverse surface S2 of the circuit board 10 have a rectangular shape and the circuit board 10 has four side surfaces 12 disposed to be continuous with respect to the surface S1 and the reverse surface S2.

Substrate through holes 11, which penetrate the circuit board 10 in a thickness direction of the circuit board 10, are disposed in the circuit board 10. The substrate through hole 11 is a hole that reaches the reverse surface S2 from the surface S1. It can be said that the substrate through hole 11 is a space surrounded by a wall surface of the resin base material. In addition, it can be said that this wall surface is an inner wall surface of the circuit board 10.

The substrate through hole 11 is a hole into which a screw 300 is inserted. In the circuit board 10, the substrate through holes 11 are disposed at, for example, four corners of a plane horizontal to the thickness direction of the circuit board 10. As illustrated in FIG. 2, the screw 300 is provided with a screw head 310 and a screw groove portion 320 on a tip side of a portion disposed to protrude from the screw head 310.

The heat generating element 21 is a circuit element that is mounted on the surface S1 of the circuit board 10 and generates heat by operating on its own. A MOSFET, an IGBT, or the like can be adopted as the heat generating element 21. In a case where the electronic device 100 is applied to the inverter device, the heat generating element 21 is, for example, a switching element disposed as a part of the inverter of the inverter device. The heat generating element 21 can be called a power element.

In addition, the heat generating element 21 is, for example, a semiconductor device in a bare chip state in which electrodes are provided on both surfaces. The heat generating element 21 is mounted on the circuit board 10 via a solder 31 in a state where a mounting surface of the heat generating element 21 faces the surface S1 of the circuit board 10. In other words, the heat generating element 21 is mounted on the circuit board 10 with the electrode on the mounting surface side being electrically and mechanically connected to the solder 31. Furthermore, the heat generating element 21 is mounted, via the solder 31, on the land disposed on the surface S1 of the circuit board 10. The heat generating element 21 may also be mounted on the circuit board 10 via a conductive adhesive other than the solder 31.

A clip 34 is mechanically and electrically connected to a non-mounting surface of the heat generating element 21, which is the surface opposite to the mounting surface toward the circuit board 10. The clip 34 is a member that has a metal such as copper as its main component. The clip 34 is a member in which an element side portion that faces the non-mounting surface of the heat generating element 21, a substrate side portion that faces the surface S1 of the circuit board 10, and a linking portion that links the element side portion and the substrate side portion to each other are integrally disposed. The element side portion of the clip 34 is electrically and mechanically connected to the electrode on the non-mounting surface side of the heat generating element 21 and the substrate side portion of the clip 34 is electrically and mechanically connected to the land of the circuit board 10. The clip 34 is, for example, electrically and mechanically connected to the heat generating element 21 and the circuit board 10 via a conductive connection member such as a solder.

The clip 34 functions not only as a terminal for electrically connecting the heat generating element 21 and the circuit board 10 to each other but also as a heat sink for dissipating the heat emitted from the heat generating element 21. As described above, the clip 34 is electrically and mechanically connected to the non-mounting surface of the heat generating element 21. Therefore, the heat emitted from the heat generating element 21 is transferred from the non-mounting surface to the element side portion of the clip 34. Accordingly, it can be said that the clip 34 is disposed such that the heat emitted from the heat generating element 21 is likely to be dissipated from the non-mounting surface side.

The element side portion of the clip 34 is electrically and mechanically connected to the electrode on the non-mounting surface side while facing the entire non-mounting surface of the heat generating element 21. In this manner, the clip 34 can be more improved in terms of heat dissipation than in a case where the element side portion faces only a part of the non-mounting surface. Nevertheless, the element side portion of the clip 34 may also be electrically and mechanically connected to the electrode on the non-mounting surface side while facing only a part of the non-mounting surface. In addition, the object of the present disclosure can be achieved even without the clip 34.

The mold resin 40 is formed of, for example, a mixture of resin such as epoxy-based resin and a filler such as $AL_2O_3$. The mold resin 40 is disposed on the surface S1 and seals the heat generating element 21. In addition, the mold resin 40 integrally seals connection portions between the heat generating element 21 and the circuit board 10, that is, the land and the solder 31, in addition to the heat generating element 21. Furthermore, the mold resin 40 integrally seals the clip 34, a connection portion between the clip 34 and the heat generating element, and a connection portion between the clip 34 and the circuit board 10 with the heat generating element 21. The mold resin 40 according to the present embodiment integrally seals the in-mold elements 22 and 23 and connection portions between the in-mold elements 22 and 23 and the circuit board 10, that is, the land and the solders 32 and 33, with the heat generating element 21.

Moreover, it can be said that the mold resin 40 seals the heat generating element 21 and so on while being in close contact with at least a part of the surface S1 of the circuit board 10. In the present embodiment, the mold resin 40 is adopted that is disposed in close contact with the entire surface S1 of the circuit board 10. In other words, the entire surface S1 of the circuit board 10 is sealed by the mold resin 40.

As described above, the mold resin 40 is also disposed on the element side portion of the clip 34. In other words, the mold resin 40 is also disposed on the side opposite to the side of the element side portion to which the heat generating element 21 is connected. It is preferable that the mold resin 40 that is disposed on this opposite side has a thickness which is as small as possible and capable of ensuring insulation of the clip 34. This is because the electronic device 100 dissipates the heat emitted from the heat generating element 21 via the clip 34 and the mold resin 40.

Since the heat generating element 21 and the in-mold elements 22 and 23 are sealed by the mold resin 40, adhesion of dust or the like to these elements can be restricted in the electronic device 100. In addition, the electronic device 100 is capable of ensuring connection reliability between the heat generating element 21, the in-mold elements 22 and 23, and so on and the circuit board 10 since the connection portion between the heat generating element 21 and the circuit board 10, the connection portions between the in-mold elements 22 and 23 and the circuit board 10, and the like are sealed.

In the electronic device 100, only the surface S1 side of the circuit board 10 is sealed by the mold resin 40 as described above. Accordingly, it can be said that the electronic device 100 is a half mold package. The mold resin 10 can be provided by compression molding.

In addition, side surfaces 42 of the mold resin 40 are disposed along the respective side surfaces 12 of the circuit board 10. Accordingly, each side surface 12 and each side surface 42 are disposed to be flush with each other. The surface of the mold resin 40 that is opposite to the surface in contact with the surface S1 is disposed to be flat. Accordingly, the resin structure in which the mold resin 40 is provided on the circuit board 10 has the shape of a rectangular parallelepiped. In the following description, the surface of the mold resin 40 that is opposite to the surface in contact with the surface S1 will be referred to as a mold-opposite surface.

Mold through holes 41 penetrating the mold resin 40 in a thickness direction of the mold resin 40 are disposed at positions of the mold resin 40 facing the substrate through holes 11 in the circuit board 10. The mold through hole 41 is disposed to communicate with the substrate through hole 11. Accordingly, it can be said that through holes penetrating the resin structure and reaching the mold opposite surface from the reverse surface S2 are disposed in the resin structure. It can also be said that the mold through hole 41 is surrounded by a wall surface of the mold resin 40. It can be said that this wall surface is an inner wall surface of the mold resin 40. In the following description, the through hole that is formed by the substrate through hole 11 and the mold through hole 41 communicating with the substrate through hole 11 will be referred to as a device through hole in some cases.

Figure 3:
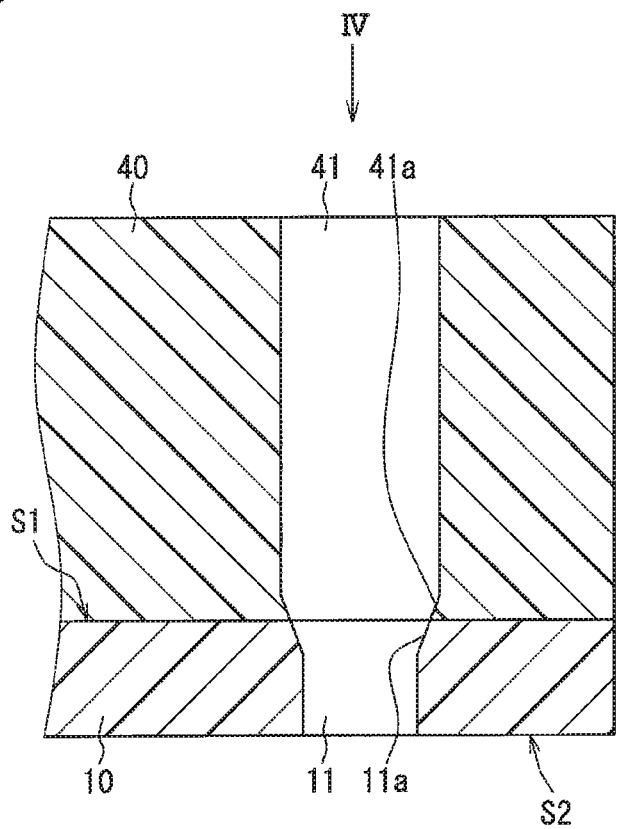
FIG. 3 is a block diagram illustrating a schematic configuration of a navigation apparatus according to the embodiment.

As illustrated in FIG. 3, the circuit board 10 is provided with a resin inclined portion 11a that is inclined such that an opening area of the substrate through hole 11 decreases toward the reverse surface S2 side from an open end on the surface S1 side. Accordingly, the substrate through hole 11 has a structure widening toward the surface S1 side from the reverse surface S2 side. In this manner, the resin inclined portion 11a is a part of the resin base material. The resin inclined portion 11a is equivalent to a substrate inclined portion. The resin inclined portion 11a is provided in the circuit board 10 without reaching the reverse surface S2 from the surface S1. This resin inclined portion 11a is a portion deformed by a pin 460, which blocks the substrate through hole 11, while providing the mold through hole 41 during molding of the mold resin 40.

Figure 4:
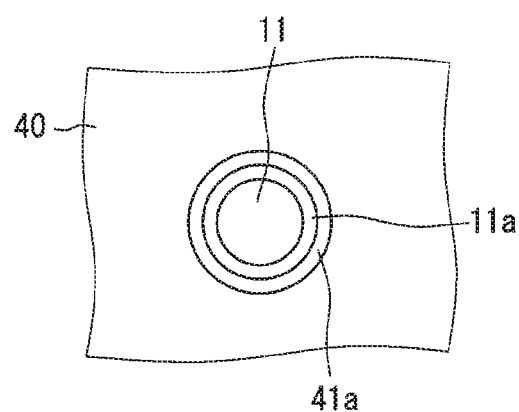
FIG. 4 is a block diagram illustrating the schematic configuration of the navigation apparatus according to the embodiment.

As illustrated in FIG. 3, the mold resin 40 is provided with a mold inclined portion 41a that is inclined such that an opening area of the mold through hole 41 increases toward the mold-opposite surface side from the open end on the surface S1 side. Accordingly, the mold through hole 41 has a structure widening toward the mold-opposite surface side from the surface S1 side. A surface of the mold inclined portion 41a is provided to be flush with a surface of the resin inclined portion 11a. The mold inclined portion 41a is provided in the mold resin 40 without reaching the mold-opposite surface from the surface S1. In a case where FIG. 3 is seen in a direction of an arrow IV, the resin structure shows the mold inclined portion 41a and the resin inclined portion 11a as illustrated in FIG. 4.

The mold through hole 41 is a portion where the pin 460 is placed during the molding of the mold resin 40. The mold inclined portion 41a is a portion where a chevron portion 462 of the pin 460 is placed during the molding of the mold resin 40. The pin 460 will be described later.

The electronic device 100 that has the configuration described above is mounted on a metal base 200 as illustrated in FIGS. 1 and 2. The electronic device 100 is mounted on the metal base 200 in a state where the reverse surface S2 of the circuit board 10 is thermally connected to the metal base 200. Accordingly, the electronic device 100 is capable of dissipating heat generated by the electronic device 100 to the metal base 200.

The metal base 200 is a member that has a metal such as aluminum and copper as its main component. The metal base 200 is, for example, a part of a case for accommodating the electronic device 100 and a part of mounting equipment on which the electronic device 100 is mounted. A vehicle traveling motor, an engine, and the like can be adopted as the mounting equipment.

The electronic device 100 is fixed to the metal base 200 by the screw 300 being inserted into the device through hole and the screw groove portion 320 being fastened to a screw hole of the metal base 200. In other words, the electronic device 100 is subjected to screwing with respect to the metal base 200 by the screw 300. In other words, the electronic device 100 is fixed to the metal base 200 by tightening of the screw 300.

The electronic device 100 is fixed to the metal base 200 by the screws 300 inserted into the device through holes at four corners, and thus separation of the electronic device 100 from the metal base 200 attributable to vibration and the like can be restricted. Likewise, floating of the reverse surface S2 from the metal base 200 can be restricted in this electronic device 100. The vehicle might be subjected to a significant vibration or a continuous vibration depending on a road situation on which the vehicle travels. However, even in such cases, separation of the electronic device 100 from the metal base 200 can be restricted and floating of the reverse surface S2 from the metal base 200 can be restricted in this electronic device 100. Accordingly, the electronic device 100 is capable of restricting a decline in heat dissipation that is attributable to separation from the metal base 200. In other words, the electronic device 100 is capable of restricting a decrease in contact area with respect to the metal base 200 that is attributable to vibration and the like, and thus is capable of restricting a decline in heat dissipation.

Stress is applied from the screw head 310 to the electronic device 100 since the electronic device 100 is fixed to the metal base 200 by tightening of the screw 300. An electronic device in which a through hole into which a fixing screw is inserted is disposed in either a circuit board or a mold resin is conceivable although this is no part of the related art. In this type of electronic device, stress from a screw head is applied to either the circuit board or the mold resin. Accordingly, it is conceivable that this electronic device has a reinforcing member for an increase in rigidity disposed at the circuit board or the mold resin in which the through hole is disposed for the electronic device to withstand the stress from the screw head.

In contrast, the stress from the screw head 310 is applied to the circuit board 10 and the mold resin 40 in this electronic device 100. In other words, the electronic device 100 has enhanced rigidity in the portions to which the stress is applied from the screw head 310. Therefore, the electronic device 100 is capable of withstanding the stress from the screw head 310 even without any reinforcing member and even in a case where the electronic device 100 is assembled with the metal base 200 by the screw 300 being used.

In the present embodiment, the electronic device 100 that is fixed to the metal base 200 by the four screws 300 being used is adopted as illustrated in FIG. 1. In the present disclosure, however, the fixing to the metal base 200 may also be performed by a fixing member other than the screw 300 being used. Examples of the fixing member that can be adopted include a fixing pin including a head portion that abuts against the mold-opposite surface, a deformation portion that is elastically deformed by being inserted into the metal base 200, and a columnar portion that is placed in the device through hole and is a portion which connects the head portion and the deformation portion to each other.

It can be said that the metal base 200 is a mounting target member in that the electronic device 100 is mounted on the metal base 200. In addition, the electronic device 100 may be attached to the metal base 200 via a heat conductive member such as thermal grease between the circuit board 10 and the metal base 200.

Figure 5:
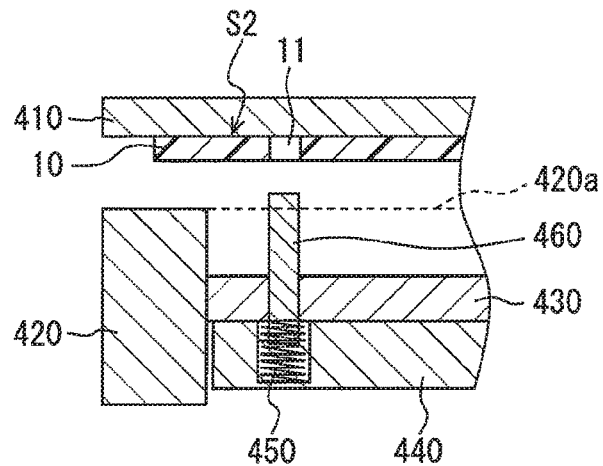
FIG. 5 is a cross-sectional view illustrating a fixing process of a manufacturing method according to the embodiment.

Hereinafter, a method for manufacturing the electronic device 100 will be described. This manufacturing method as an example is a method for manufacturing the electronic device 100 by using a compression molding machine that is configured to have an upper mold 410, a clamp mold 420, a first lower mold 430, a second lower mold 440, a spring 450, and the pin 460 as illustrated in FIG. 5 and so on.

The upper mold 410, which is equivalent to a first mold, has a flat surface to which the circuit board 10 is fixed. The upper mold 410 is placed in parallel to, for example, a ground surface. The flat surface of the upper mold 410 is provided on the ground surface side. The circuit board 10 is fixed to the flat surface in a state where the reverse surface S2 faces the flat surface of the upper mold 410. In addition, the circuit board 10 is fixed to the upper mold 410 by a vacuum clamp, a mechanical clamp, or the like. The method for fixing the circuit board 10 to the upper mold 410 is not particularly limited. In the following description, a direction of gravity will be regarded as a downward direction and the direction opposite to the direction of gravity will be regarded as an upward direction.

The clamp mold 420, the first lower mold 430, and the second lower mold 440 are equivalent to a second mold. The clamp mold 420, the first lower mold 430, and the second lower mold 440 are lower molds with respect to the upper mold 410. In the following description, the clamp mold 420, the first lower mold 430, and the second lower mold 440 will be collectively referred to as the lower mold in some cases.

This lower mold and the upper mold 410 are a pair of molds that is a part of the compression molding machine. In addition, the lower mold and the upper mold 410 are capable of relatively approaching each other and moving away from each other by, for example, the lower mold being raised and lowered. The lower mold is placed below the upper mold 410 in a state where the lower mold faces the upper mold 410. A hole that is surrounded by an annular wall surface is disposed in the clamp mold 420. Sign 420a in FIG. 5 and so on indicates a tip surface of this wall surface. When the mold resin 40 is molded, the tip surface of the clamp mold 420 comes into close contact with the surface S1 of the circuit board 10.

The first lower mold 430 and the second lower mold 440 are placed in the hole in the clamp mold 420 such that the first lower mold 430 and the second lower mold 440 are capable of moving in the upward direction and the downward direction along the hole. In other words, the first lower mold 430 and the second lower mold 440 are configured to be capable of moving, in an integrated manner, in the upward direction and the downward direction within a range between a lowermost position and an uppermost position.

A recessed cavity is provided in the lower mold by the wall surface of the clamp mold 420 and an upper surface of the first lower mold 430 and a constituent material of the mold resin 40 is placed in this recessed cavity. In other words, the upper surface of the first lower mold 430 is a bottom surface of the cavity.

The first lower mold 430 and the second lower mold 440 are fixed to each other. Accordingly, the upper surface of the first lower mold 430 is a surface that faces the circuit board 10 and a lower surface of the first lower mold 430 is a surface that is fixed to the second lower mold 440. A hole in which the pin 460 is placed is disposed in the first lower mold 430. A recessed portion in which the spring 450 is placed is disposed in the second lower mold 440 and the spring 450 applies a force in the upward direction to the pin 460.

Figure 12:
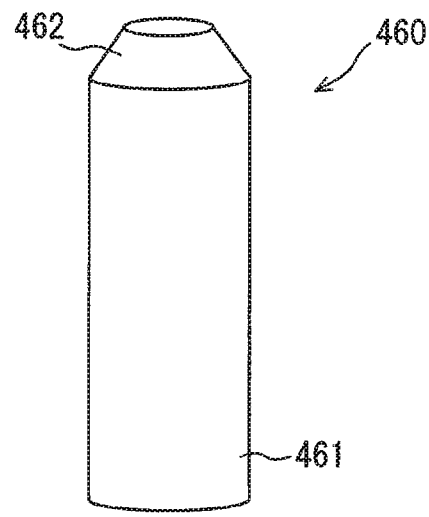
FIG. 12 is a perspective view illustrating a schematic configuration of a pin according to the embodiment.

The pin 460 is equivalent to a pressing member. As illustrated in FIG. 5 and so on, the pin 460 is a member that is disposed to protrude from the bottom surface of the cavity and presses the circuit board 10. As illustrated in FIG. 12, a columnar portion 461 that protrudes from the bottom surface of the cavity and the chevron portion 462 that is disposed at a tip of the columnar portion 461 on the side opposite to the bottom surface are disposed in the pin 460. The chevron portion 462 is shaped such that its diameter decreases as a distance from its bottom portion increases. In the present embodiment, the pin 460 is adopted that has the columnar portion 461 which has the shape of a cylindrical column and the chevron portion 462 which has the shape of a truncated cone. A part of the chevron portion 462 is a part for blocking the substrate through hole 11 and providing the resin inclined portion 11a by deforming the circuit board 10. The other part of the chevron portion 462 is a part for providing the mold inclined portion 41a.

In this manufacturing method, the compression molding machine described above is used and a fixing process, a resin spraying process, a first raising process, a second raising process, a dwelling process, a first release process, and a second release process are performed in this order as illustrated in FIGS. 5 to 11.

In the fixing process, the circuit board 10 is fixed to the upper mold 410 as illustrated in FIG. 5. In this fixing process, the fixing is performed in a state where the reverse surface S2 of the circuit board 10 faces the flat surface of the upper mold 410. At this time, the circuit board 10 is in a state where the substrate through hole 11 is provided therein and the heat generating element 21, the clip 34, and the like are mounted thereon. In addition, the circuit board 10 has no resin inclined portion 11a provided therein at this time. As a matter of course, the mold resin 40 is not provided on the circuit board 10.

During the fixing process, the clamp mold 420 is not in contact with the circuit board 10 and the first lower mold 430 and the second lower mold 440 are placed at the lowermost position. In addition, the pin 460 is placed at a position that faces the substrate through hole 11. The pin 460 is disposed to protrude from the tip surface 420a in a state where the first lower mold 430 and the second lower mold 440 are placed at the lowermost position.

Figure 6:
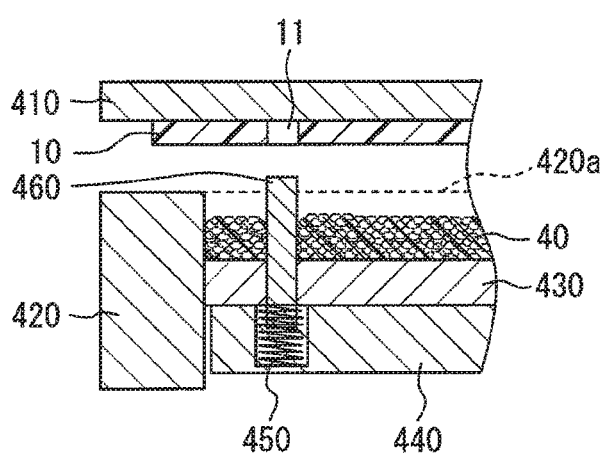
FIG. 6 is a cross-sectional view illustrating a resin spraying process of the manufacturing method according to the embodiment.

In the resin spraying process, the constituent material of the mold resin 40 is put into the cavity as illustrated in FIG. 6. In other words, in the resin spraying process, the granular constituent material of the mold resin 40 is sprayed into the cavity. In this drawing, the same sign 40 is given to both the constituent material and the mold resin 40 for the sake of convenience.

Figure 7:
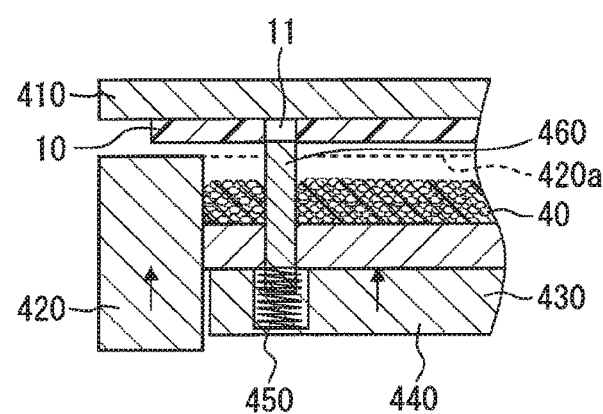
FIG. 7 is a cross-sectional view illustrating a first raising process of the manufacturing method according to the embodiment.
Figure 13:
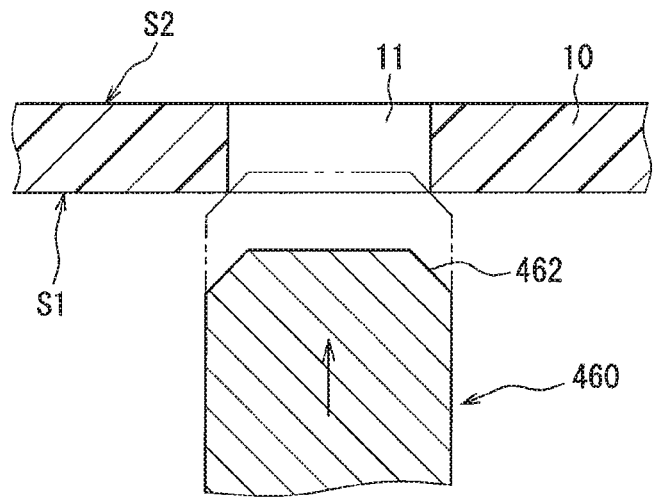
FIG. 13 is an enlarged cross-sectional view of a substrate through hole part at a time of the first raising process.

In the first raising process, the lower mold is raised in a direction of arrows as illustrated in FIG. 7. The first raising process will be described with reference to FIG. 13 as well. FIG. 13 is an enlarged cross-sectional view of the substrate through hole 11 part at a time of the first raising process.

In the first raising process, the pin 460 is raised along with the lower mold. Since the pin 460 protrudes from the tip surface 420a, the pin 460 comes into contact with the circuit board 10 before the tip surface 420a comes into contact with the circuit board 10. In the first raising process, the pin 460 is pressed against the circuit board 10 from the surface S1 side and an opening of the substrate through hole 11 on the surface S1 side is blocked by the pin 460 being raised. Accordingly, the substrate through hole 11 is closed by the pin 460 as illustrated by a two-dot chain line in FIG. 13. Nevertheless, stress to the point of causing the resin inclined portion 11a to be provided is not applied to the circuit board 10 although the pin 460 is in contact with the circuit board 10. In other words, stress from the pin 460 to the circuit board 10 is insufficient for the resin inclined portion 11a to be provided by the circuit board 10 being deformed. In addition, an elastic force from the spring 450 is not applied to the pin 460.

Figure 8:
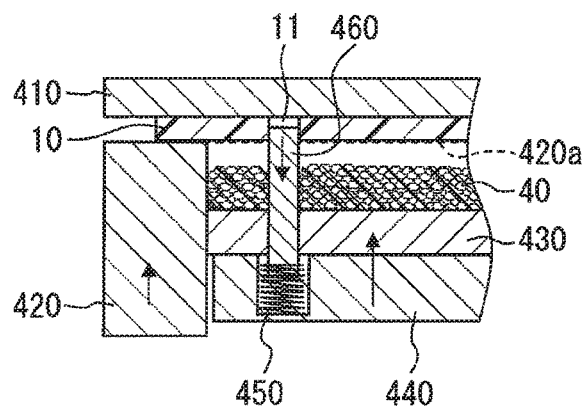
FIG. 8 is a cross-sectional view illustrating a second raising process of the manufacturing method according to the embodiment.
Figure 14:
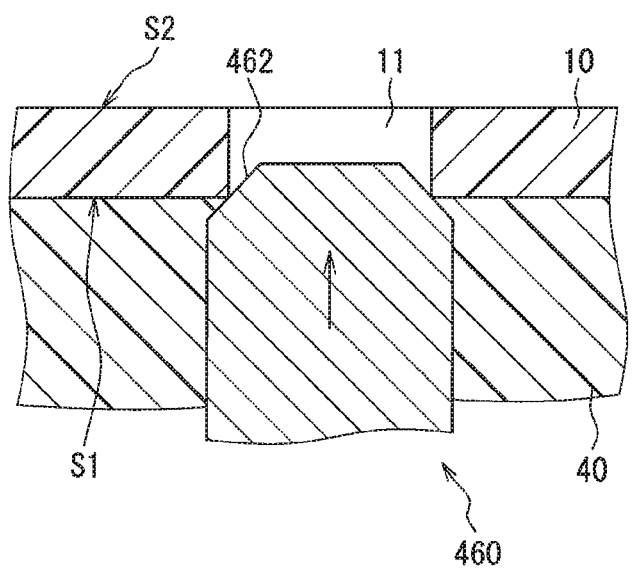
FIG. 14 is an enlarged cross-sectional view of the substrate through hole part at a time of the second raising process.

In the second raising process, the lower mold is further raised in an up-arrow direction from the state of the first raising process as illustrated in FIG. 8. The second raising process will be described with reference to FIG. 14 as well. FIG. 14 is an enlarged cross-sectional view of the substrate through hole 11 part at a time of the second raising process. Although the mold resin 40 is illustrated in FIG. 14, no mold resin 40 is provided in the second raising process.

In this second raising process, the pin 460 is pressed against the circuit board 10, by the lower mold being raised, in a state where a part of the pin 460 is inserted into the substrate through hole 11. In the present embodiment, the pin 460 is pressed against the circuit board 10 in a state where a part of the chevron portion 462 is inserted into the substrate through hole 11 as illustrated in FIG. 14. In the second raising process, the pin 460 is pressed against the circuit board 10 with a pressing force that is sufficient for a deformation of the circuit board 10. The pin 460 is pressed against the circuit board 10 by the elastic force from the spring 450 being applied. Accordingly, the pin 460 is subjected to a reaction force in a down-arrow direction in FIG. 8.

In the second raising process, the circuit board 10 is then deformed to be inclined such that the opening area of the substrate through hole 11 decreases toward the reverse surface S2 side from the open end on the surface S1 side as illustrated in FIG. 14. In other words, the resin inclined portion 11a is provided in the circuit board 10 in this second raising process. In other words, the resin inclined portion 11a is provided in the second raising process by a part of the circuit board 10 being crushed by the chevron portion 462. In addition, in the second raising process, the opening of the substrate through hole 11 is blocked in a state where the circuit board 10 is deformed by the pin 460. The second raising process is equivalent to a blocking process in this manner.

In the second raising process, the substrate through hole 11 is blocked by the pin 460 and the tip surface 420a of the clamp mold 420 is pressed against the circuit board 10, and thus a sealed space is provided by the clamp mold 420, the first lower mold 430, the pin 460, and the circuit board 10. In other words, the cavity is put into a sealed state. In the present embodiment, only a part of the chevron portion 462 is inserted into the substrate through hole 11 as illustrated in FIG. 14. Accordingly, the rest of the chevron portion 462 is placed in a region facing the surface S1 outside the substrate through hole 11.

Figure 9:
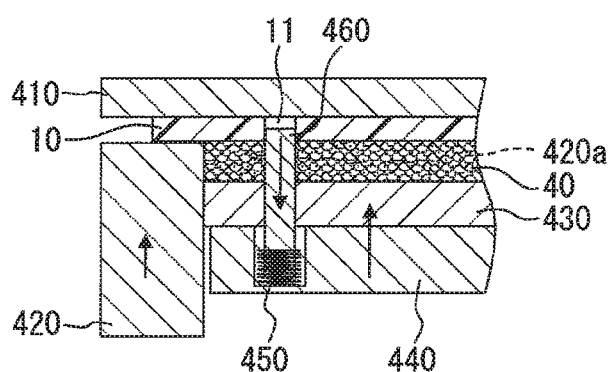
FIG. 9 is a cross-sectional view illustrating a dwelling process of the manufacturing method according to the embodiment.

In the dwelling process, the first lower mold 430 and the second lower mold 440 are raised in the upward direction in the hole in the clamp mold 420 as illustrated in FIG. 9 so that molding pressure is applied to the constituent material. The dwelling process is equivalent to a molding process. In the dwelling process, the pin 460 is pressed against the circuit board 10 by the lower mold being raised in a state where the spring 450 is completely contracted by the pin 460. In addition, in the dwelling process, the first lower mold 430 and the second lower mold 440 are raised and reach the uppermost position.

At this time, the clamp mold 420 presses the circuit board 10 in a direction of an arrow in FIG. 9 so that a gap leading to leakage of the constituent material is not formed between the tip surface 420a and the circuit board 10. In other words, the tip surface 420a is in close contact with one surface. In other words, the dwelling process is a state where the lower mold is fixed to the circuit board 10 such that the cavity faces the surface S1. The tip surface 420a of the clamp mold 420 may be in close contact with the upper mold 410.

In addition, the chevron portion 462 presses the circuit board 10 so that a gap leading to leakage of the constituent material is not formed between the chevron portion 462 and the circuit board 10. More specifically, the chevron portion 462 blocks the substrate through hole 11 in a state where the resin inclined portion 11a is provided by the circuit board 10 being crushed. Accordingly, the surface of the resin inclined portion 11a is in close contact with the chevron portion 462 so that no constituent material leaks out, and thus it can be said that the surface of the resin inclined portion 11a is a seal surface that blocks the substrate through hole 11. In this manner, the substrate through hole 11 is in a state of being blocked by the pin 460.

In the dwelling process, the mold resin 40 is molded in the above-described state where the cavity is sealed by the lower mold being fixed to the circuit board 10 and the substrate through hole 11 being blocked by the pin 460. In other words, in the dwelling process, the mold resin 40 is molded by the constituent material being hardened with the constituent material in the cavity covering the surface S1, the heat generating element 21, and the like. More specifically, in the dwelling process, the mold resin 40 is molded by the first lower mold 430 applying the molding pressure to the constituent material while heat is applied to the constituent material. Then, the mold resin 40 is provided on the surface S1 of the circuit board 10. Still, the mold resin 40 is in a state where the pin 460 remains inserted as illustrated in FIG. 9.

Figure 10:
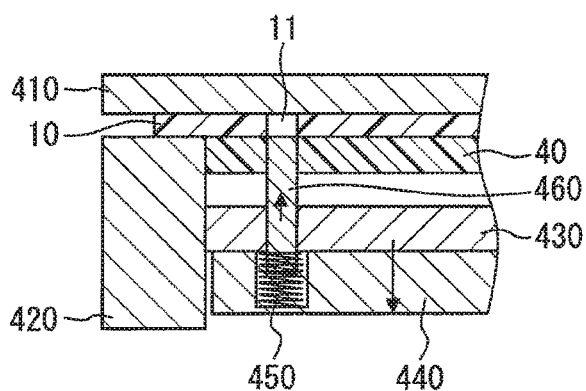
FIG. 10 is a cross-sectional view illustrating a first release process of the manufacturing method according to the embodiment.

In the first release process, the first lower mold 430 and the second lower mold 440 are lowered in the downward direction in the hole in the clamp mold 420, as illustrated in FIG. 10, after the molding of the mold resin 40. At this time, the pin 460 is lowered along with the first lower mold 430 and the second lower mold 440 while the elastic force from the spring 450 is applied in the up-arrow direction.

Figure 11:
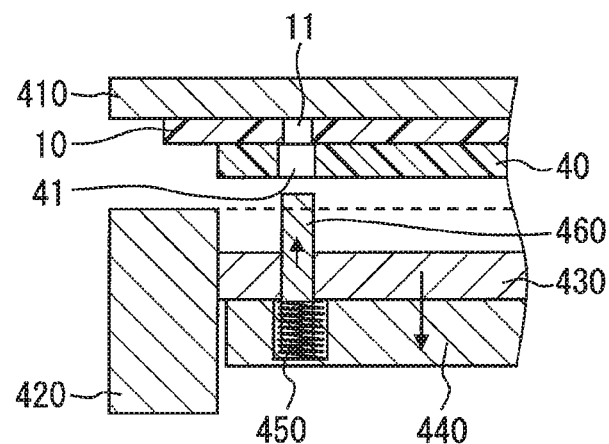
FIG. 11 is a cross-sectional view illustrating a second release process of the manufacturing method according to the embodiment.
Figure 15:
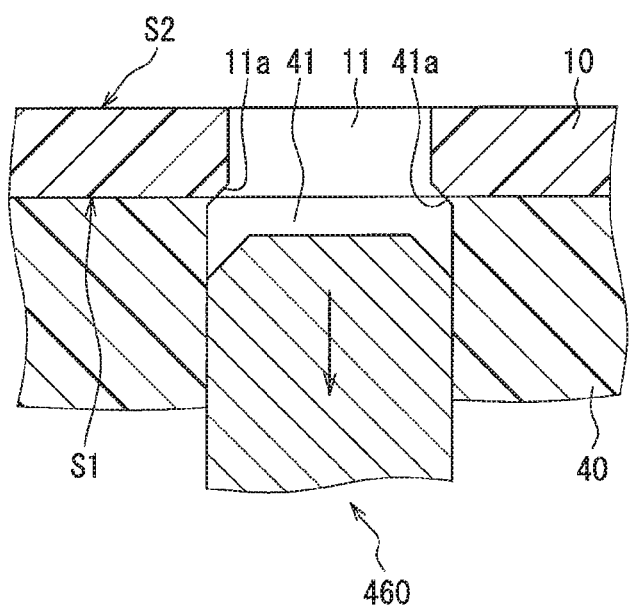
FIG. 15 is an enlarged cross-sectional view of the substrate through hole part at a time of the second release process.

As illustrated in FIG. 11, the lower mold is also lowered in the second release process. The second release process will be described with reference to FIG. 15 as well. FIG. 15 is an enlarged cross-sectional view of the substrate through hole 11 part at a time of the second release process.

In this second release process, the pin 460 is withdrawn from the mold resin 40 by the lower mold being lowered. As illustrated in FIGS. 11 and 15, the mold through hole 41 is provided in the mold resin 40 by the pin 460 being withdrawn. In other words, a region of the mold resin 40 into which the pin 460 is inserted during the dwelling process becomes the mold through hole 41. In the present embodiment, an example is adopted in which only a part of the chevron portion 462 is inserted into the substrate through hole 11, and thus the mold inclined portion 41a is provided in the mold resin 40 as illustrated in FIG. 15.

Figure 16:
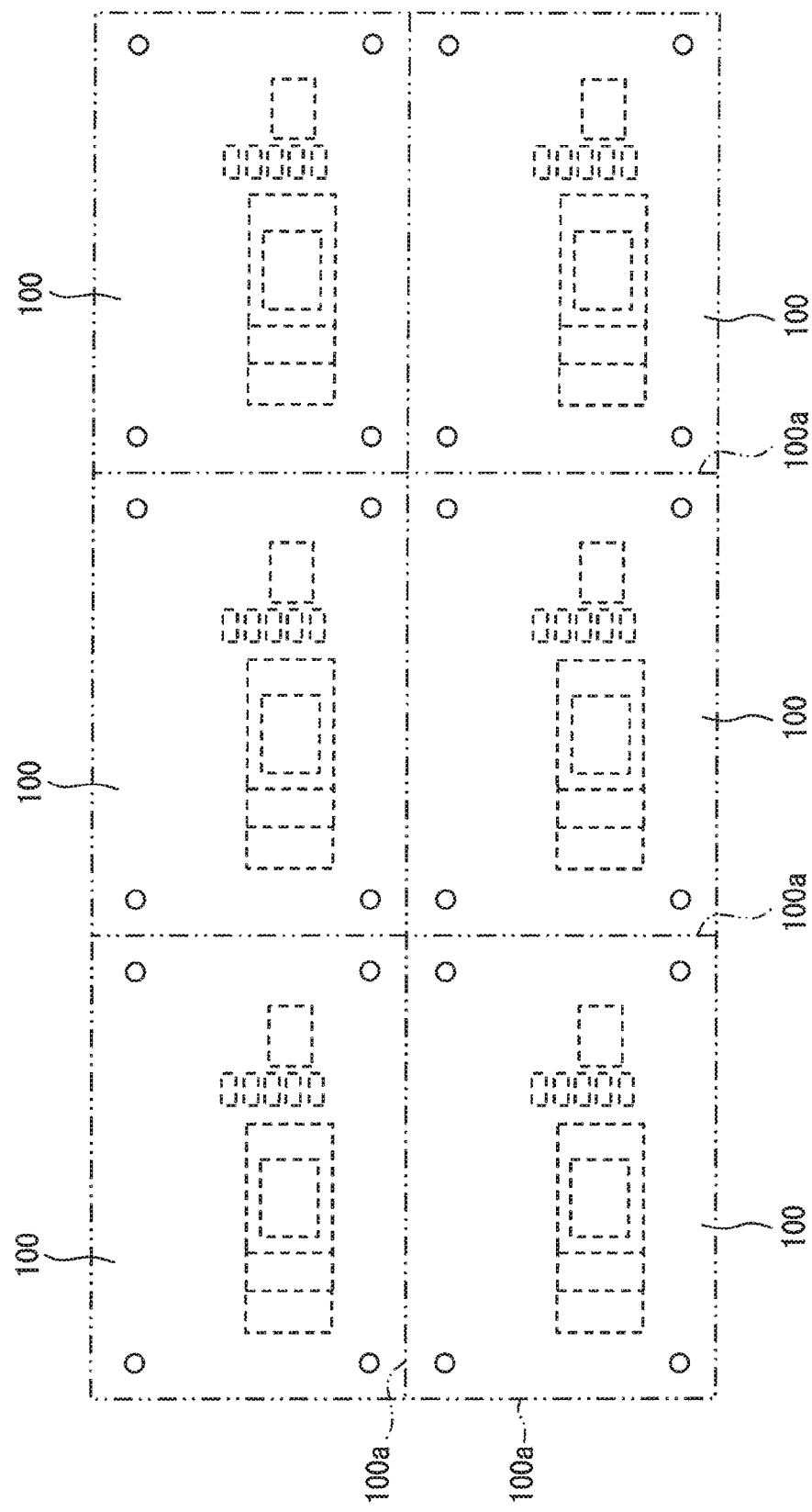
FIG. 16 is a top view illustrating a schematic configuration of a mold package structure according to the embodiment.

In the present disclosure, a manufacturing method can also be adopted for dividing a package structure into the individual electronic devices 100 by dicing the package structure, in which the multiple electronic devices 100 are integrally provided as illustrated in FIG. 16, based on dicing lines 100a.

In this case, a base substrate in which the multiple circuit boards 10 are integrally disposed is adopted in the fixing process. This base substrate is a base substrate in which multiple substrate regions scheduled to turn into the multiple circuit boards 10 are provided, with the substrate through hole 11 being provided and the heat generating element 21 and the like being mounted in each of the substrate regions. In addition, an upper mold that is adopted as the upper mold 410 in this case has a flat surface comparable to or wider than the entire reverse surface S2 of the base substrate. Furthermore, a lower mold that has a cavity which is sufficient in size to cover the entire reverse surface S2 of the base substrate is adopted. The processes following the fixing process are similar to those described above except that the base substrate is fixed to the upper mold 410. By this manufacturing method, a mold package structure can be manufactured by execution of up to the second release process.

A dicing process is executed thereafter. In the dicing process, the mold package structure that is illustrated in FIG. 16 is diced along the dicing lines 100a. The mold package structure is divided into the multiple electronic devices 100 in this dicing process. According to this manufacturing method, the electronic device 100 in which the mold resin 40 is disposed on the entire surface S1 of the circuit board 10 can be manufactured with ease.

According to this manufacturing method, the electronic device 100 is manufactured by the pin 460 pressing the circuit board 10 being used in addition to the upper mold 410 and the lower mold as described above. This pin 460 is disposed to protrude from the bottom surface of the cavity in the lower mold.

In this manufacturing method, the circuit board 10 is fixed to the upper mold 410 in a state where the reverse surface S2 of the circuit board 10 faces the flat surface of the upper mold 410. In addition, in this manufacturing method, the opening of the substrate through hole 11 on the surface S1 side is blocked by the pin 460 being pressed against the circuit board 10 from the surface S1 side. In this manufacturing method, the pin 460 is pressed against the circuit board 10 in a state where a part of the pin 460 is inserted into the substrate through hole 11 when the opening on the surface S1 side is blocked by the pin 460, and thus the opening on the surface S1 side is blocked in a state where the circuit board 10 is deformed. At this time, the circuit board 10 is deformed to be inclined such that the opening area of the substrate through hole 11 decreases toward the reverse surface S2 side from the surface S1 side. In other words, the resin inclined portion 11a is provided in the circuit board 10.

According to this manufacturing method, the mold resin is molded in a state where the tip surface 420a is fixed to the surface S1 such that the cavity faces one surface and the cavity is sealed by the opening on the surface S1 side being blocked by the pin 460. In other words, according to this manufacturing method, the mold resin 40 is molded by the constituent material being hardened with the constituent material in the cavity covering the surface S1, the heat generating element 21, and the like. By this manufacturing method, the electronic device 100 can be manufactured in this manner. In addition, the electronic device 100 that has the mold resin 40 in which the mold through hole 41 is provided can be manufactured by this manufacturing method since the dwelling process is performed in a state where the pin 460 is disposed to protrude from the bottom surface of the cavity and is inserted into the substrate through hole 11.

By this manufacturing method, penetration of the substrate through hole 11 by the constituent material can be restricted since the substrate through hole 11 is blocked by the pin 460. Furthermore, by this manufacturing method, penetration of the substrate through hole 11 by the constituent material can be further restricted since molding is performed in a state where the pin 460 is pressed against the circuit board 10 so that the circuit board 10 is deformed. In other words, the chevron portion 462 is pressed against the seal surface with a force that is sufficient to deform the circuit board 10. Accordingly, by this manufacturing method, sealability between the chevron portion 462 and the circuit board 10 can be more improved than in a case where a jig is pressed that blocks the substrate through hole 11 to the point of not deforming the circuit board 10.

In this manufacturing method, the circuit board 10 is deformed by the chevron portion 462 being pressed against the circuit board 10, and thus the seal surface that blocks the substrate through hole 11 can be provided not in a direction along the surface S1 but in a direction at an angle to the surface S1. Accordingly, by this manufacturing method, the electronic device 100 can be manufactured with an increase in planar-direction size being restricted compared to a case where a seal surface equal in area to the seal surface is provided on the surface S1 of the circuit board 10. In addition, the electronic device 100 can become more compact in planar-direction size than an electronic device in which a seal surface equal in area to the seal surface is provided on one surface of the circuit board. The planar direction means a direction along a plane that is orthogonal to a thickness direction of the electronic device 100.

As illustrated in FIG. 2, the screw 300 is inserted into the electronic device 100 from the mold opposite surface side, that is, from the surface S1 side. Since the resin inclined portion 11a is disposed in the electronic device 100, the screw 300 can be inserted with ease into the substrate through hole 11. In addition, the insertion of the screw 300 can be further facilitated since the mold inclined portion 41a is disposed in the electronic device 100. In other words, the resin inclined portion 11a and the mold inclined portion 41a function as guides during the insertion of the screw 300.

In the present embodiment, an example in which the mold resin 40 is provided by a compression mold method is adopted as an example. The present disclosure is not limited thereto. According to the present disclosure, the mold resin 40 may also be provided by compression molding.

The preferred embodiment of the present disclosure has been described above. The present disclosure is not limited to the embodiment described above and can be modified in various forms without departing from the spirit of the present disclosure. First to tenth modification examples of the present disclosure will be described below. The above-described embodiment and the first to tenth modification examples can be carried out independently of one another or in an appropriate combination. The present disclosure is not limited to the combination described in the embodiment and can be carried out in various types of combination.

First Modification Example

Figure 17:
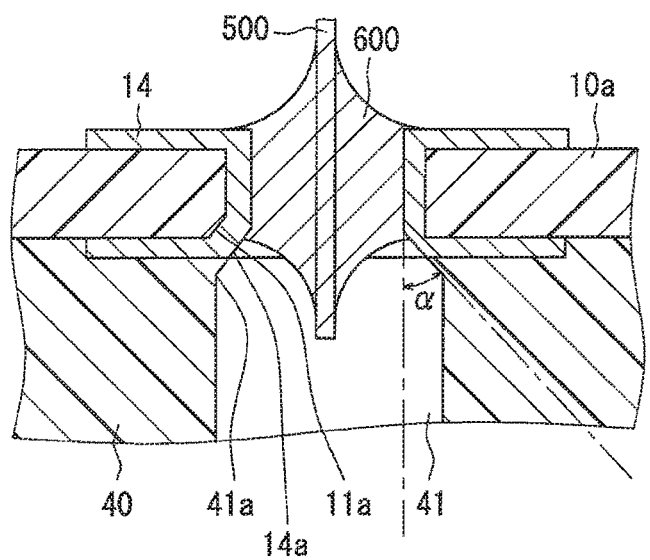
FIG. 17 is a cross-sectional view illustrating schematic configurations of a circuit board and a mold resin according to a first modification example.

An electronic device according to the first modification example has a circuit board 10a. In the circuit board 10a, conductive portions 14 are disposed on inner wall surfaces of through holes in the resin base material as illustrated in FIG. 17. In other words, the substrate through hole 11 is disposed between the conductive portions 14 in the circuit board 10a.

A metal such as copper constitutes this conductive portion 14 and the conductive portion 14 is equivalent to a conductive member. The conductive portion 14 is disposed in an annular shape over an entire circumference of the through hole in the resin base material and is also disposed on a part of the surface S1 and a part of the reverse surface S2. In other words, a region of the circuit board 10a that is surrounded by portions of the conductive portions 14 placed in the through holes in the resin base material is the substrate through hole 11. The inner wall surface means a surface that is exposed to the through hole in the resin base material in a state where the conductive portion 14 is not disposed and the through hole is disposed. The conductive portion 14 is electrically connected to the wiring 13 via, for example, a via.

The circuit board 10a is provided with a conductive inclined portion 14a as a substrate inclined portion. In other words, it can be said that the substrate inclined portion of the circuit board 10a is a part of the conductive portion 14. The resin inclined portion 11a, which is deformed when the conductive inclined portion 14a is provided, is provided in the resin base material of the circuit board 10a.

In the circuit board 10a, a terminal 500 is inserted into the substrate through hole 11 and the terminal 500 and the conductive portion 14 are electrically and mechanically connected to each other by a solder 600. The terminal 500 is a terminal of a circuit element mounted on the reverse surface S2 of the circuit board 10a, a terminal of external equipment on which the electronic device according to the first modification example is mounted, or the like. The above-described mounting equipment or the like can be adopted as the external equipment. The terminal 500 and the conductive portion 14 may be electrically and mechanically connected to each other via a conductive connection member other than the solder 600.

As described above, the solder 600 is provided in the conductive portion 14 in the circuit board 10a. It is preferable that the inner wall surface of the conductive portion 14 and the conductive inclined portion 14a form a large angle α for a fillet of the solder 600 to be provided. In other words, it is preferable that the angle α is large for mechanical connection reliability to be ensured between the conductive portion 14 and the solder 60 in the circuit board 10a. It can be said that the angle α is an angle for a deformation of the conductive portion 14. The inner wall surface of the conductive portion 14 is a surface that is exposed to the substrate through hole 11 in a state where no solder 600 is disposed in the conductive portion 14.

Figure 19:
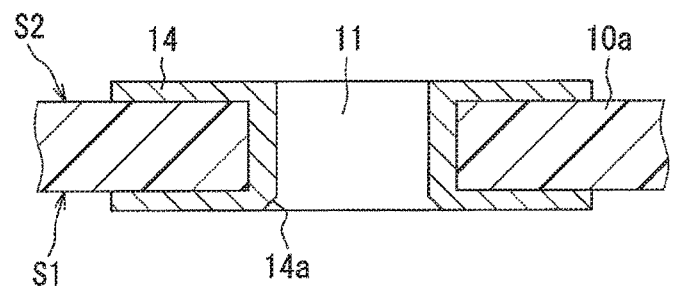
FIG. 19 is a cross-sectional view illustrating the schematic configuration of the circuit board prior to a deformation of a resin base material according to the first modification example.
Figure 20:
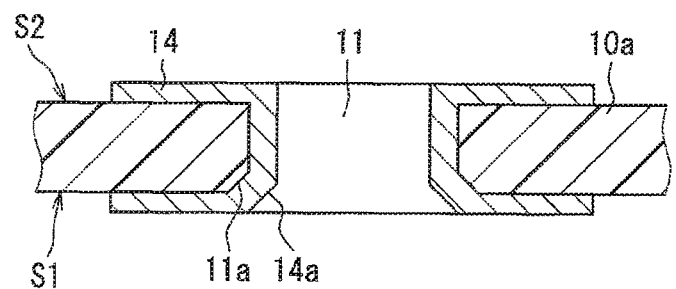
FIG. 20 is a cross-sectional view illustrating the schematic configuration of the circuit board in a state where the resin base material and the conductive portion are deformed according to the first modification example.

A method for manufacturing the electronic device according to the first modification example will be described with reference to FIGS. 18 to 20. A device for manufacturing the electronic device according to the first modification example is similar to that for the embodiment described above, and thus it will be omitted in FIGS. 18 to 20.

Figure 18:
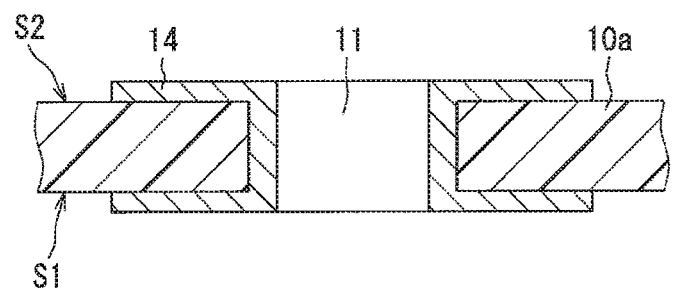
FIG. 18 is a cross-sectional view illustrating the schematic configuration of the circuit board prior to a deformation of a conductive portion according to the first modification example.

The circuit board 10a in which the conductive portion 14 is provided is prepared first as illustrated in FIG. 18. Then, a blocking process is performed as illustrated in FIGS. 19 and 20. As illustrated in FIG. 19, the conductive portion 14 is deformed in the blocking process by the circuit board 10a being pressed by the pin 460. In addition, in the blocking process, the pressing of the circuit board 10a by the pin 460 continues and the conductive portion 14 and the resin base material are deformed as illustrated in FIG. 20. In the blocking process, the conductive inclined portion 14a and the resin inclined portion 11a are provided by the conductive portion 14 and the resin base material being deformed as described above. In other words, the electronic device according to the first modification example can be manufactured by a method similar to the method for manufacturing the electronic device 100 insofar as the circuit board 10a is provided in advance with the conductive portion 14.

The first modification example is capable of achieving effects similar to those achieved by the embodiment described above. A device through hole into which the screw 300 according to the embodiment described above is inserted may be disposed in the electronic device according to the first modification example in addition to a device through hole into which the terminal 500 is inserted.

Second Modification Example

Figure 21:
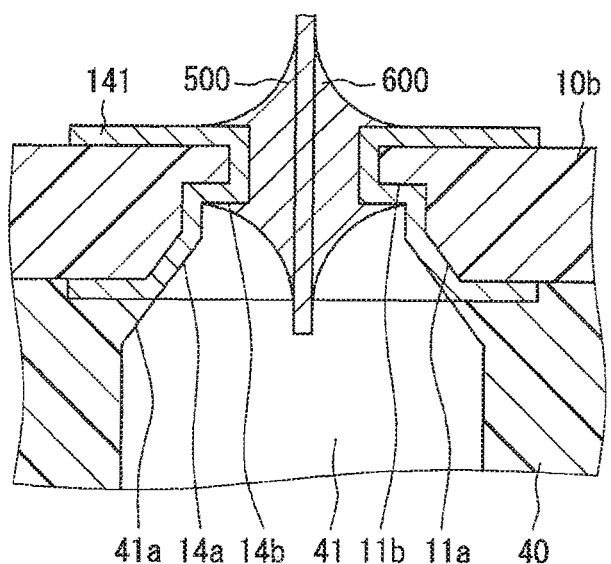
FIG. 21 is a cross-sectional view illustrating schematic configurations of a circuit board and a mold resin according to a second modification example.

An electronic device according to the second modification example has a circuit board 10b. In the circuit board 10b, a conductive portion 141 is disposed on the inner wall surface of the through hole in the resin base material as illustrated in FIG. 21. This conductive portion 141 differs in shape from the conductive portion 14. The circuit board 10b is provided with the conductive inclined portion 14a and the resin inclined portion 11a as in the case of the circuit board 10a.

The conductive portion 141 is provided with a conductive flat portion 14b that is parallel to a thickness direction of the circuit board 10b. In the circuit board 10b, the conductive flat portion 14b is provided further on the reverse surface S2 side than the conductive inclined portion 14a. The conductive flat portion 14b is provided to be continuous with respect to the conductive inclined portion 14a via a portion along the thickness direction. A resin flat portion 11b, which is deformed when the conductive flat portion 14b is provided, is provided in the resin base material of the circuit board 10b. This resin flat portion 11b is a portion that is parallel to the thickness direction of the circuit board 10b.

By a pin that differs in shape from the pin 460 being used, the electronic device according to the second modification example can be manufactured by a method similar to the method for manufacturing the electronic device 100. For example, a pin in which a small-diameter columnar portion smaller in diameter than the columnar portion 461 is provided at a tip of the chevron portion 462 of the pin 460 is adopted as the pin that is used during the manufacturing of the electronic device according to the second modification example. The conductive flat portion 14b and the resin flat portion 11b are provided by the circuit board 10b being pressed and deformed by this small-diameter columnar portion.

The second modification example is capable of achieving effects similar to those achieved by the first modification example. Since the electronic device according to the second modification example has the circuit board 10b in which the conductive flat portion 14b is provided, the solder 600 and the conductive portion 141 can be properly connected to each other when the solder 600 is placed on the conductive flat portion 14b.

Third Modification Example

Figure 22:
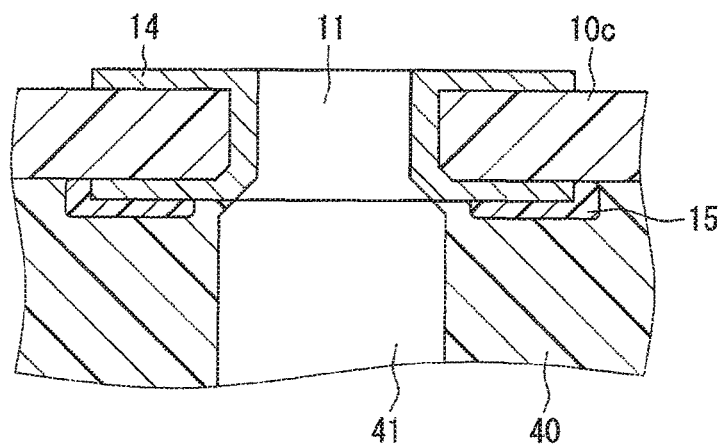
FIG. 22 is a cross-sectional view illustrating schematic configurations of a circuit board and a mold resin according to a third modification example.

As illustrated in FIG. 22, an electronic device according to the third modification example has a circuit board 10c in which a dam portion 15 is disposed on a surface of the conductive portion 14. The dam portion 15 is provided in an annular shape on the conductive portion 14 and is sealed by the mold resin 40. The dam portion 15 is provided on the conductive portion 14 before the mold resin 40 is provided. By the dam portion 15 being disposed in advance in the circuit board 10c, the electronic device according to the third modification example can be manufactured by a method similar to the method for manufacturing the electronic device according to the first modification example.

The third modification example is capable of achieving effects similar to those achieved by the embodiment described above. In the electronic device according to the third modification example, a progress of peeling of an interface between the conductive portion 14 and the mold resin 40 can be restricted when the interface between the conductive portion 14 and the mold resin 40 peels off. In the electronic device according to the third modification example, the peeling might begin to occur in a portion of the interface between the conductive portion 14 and the mold resin 40 that is exposed to the device through hole. The electronic device according to the third modification example, however, is capable of stopping the progress with the dam portion 15 when the peeling has occurred.

No conductive portion 14 may be disposed in the circuit board 10c. In this case, the dam portion 15 is capable of restricting a progress of peeling of an interface between the circuit board 10c and the mold resin 40 with the dam portion 15 being disposed on the surface S1.

Fourth Modification Example

Figure 23:
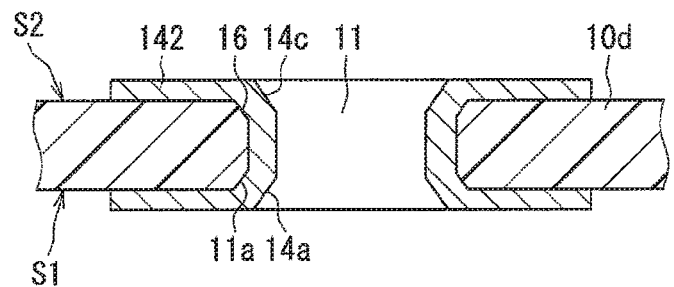
FIG. 23 is a cross-sectional view illustrating a schematic configuration of a circuit board according to a fourth modification example.

As illustrated in FIG. 23, an electronic device according to the fourth modification example has a circuit board 10d in which a guide portion 14c is disposed on the reverse surface S2 side. In the electronic device according to the fourth modification example, the mold resin 40 is provided on the surface S1 of the circuit board 10d as in the case of the electronic device 100.

In the circuit board 10d, a reverse surface side inclined portion 16 is provided in the resin base material and the reverse surface side inclined portion 16 is shaped to be inclined such that the opening area of the substrate through hole 11 decreases toward the surface S1 side from the reverse surface S2 side. In addition, a conductive portion 142 is provided with the guide portion 14c, which is a portion inclined along the reverse surface side inclined portion 16. The electronic device according to the fourth modification example can be manufactured by a method similar to the method for manufacturing the electronic device 100 by a projecting portion being disposed on the upper mold 410, the projecting portion being for providing the guide portion 14c and the reverse surface side inclined portion 16 by deforming the resin base material and the conductive portion 142.

The fourth modification example is capable of achieving effects similar to those achieved by the embodiment described above. In a case where a terminal, a screw, or the like is inserted into the substrate through hole 11 from the reverse surface S2 side in the electronic device according to the fourth modification example, the insertion of the terminal or the screw into the substrate through hole 11 can be facilitated. No conductive portion 142 may be disposed in the circuit board 10d. In this case, the reverse surface side inclined portion 16 functions as a guide portion in the circuit board 10d.

Fifth Modification Example

Figure 24:
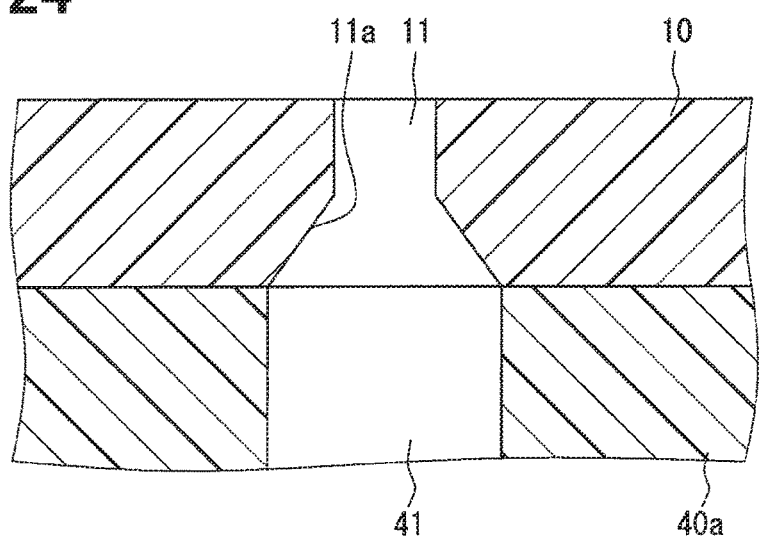
FIG. 24 is a cross-sectional view illustrating schematic configurations of a circuit board and a mold resin according to a fifth modification example.

As illustrated in FIG. 24, an electronic device according to the fifth modification example has a mold resin 40a in which no mold inclined portion is disposed. In FIG. 24, the pin 460 is illustrated by a two-dot chain line for ease of understanding of a positional relationship between the pin 460 and the circuit board 10.

The opening area of the mold through hole 41 is equal to the opening area of the open end of the substrate through hole 11 on the surface S1 side. In other words, the mold resin 40a is disposed to reach a corner portion formed by the substrate through hole 11 and the surface S1 and has a wall surface perpendicular to the surface S1 from the corner portion. This wall surface is an inner wall of the mold through hole 41. Accordingly, the mold through hole 41 is disposed to be perpendicular to the surface S1 from the open end of the substrate through hole 11 on the surface S1 side. The conductive portion 14 may be disposed in the circuit board 10.

The electronic device according to the fifth modification example can be manufactured as follows. In a blocking process, the substrate through hole 11 is blocked in a state where the entire chevron portion 462 is inserted into the substrate through hole 11 and a boundary between the columnar portion 461 and the chevron portion 462 is placed on a virtual plane along the surface S1 as illustrated by the two-dot chain line in FIG. 24. In a molding process, the mold resin 40a is molded in this state where the substrate through hole 11 is blocked as described above. Then, the electronic device according to the fifth modification example can be manufactured. In other words, the electronic device according to the fifth modification example can be manufactured by a method similar to the method for manufacturing the electronic device 100 by a pin that differs in shape from the pin 460 being used.

The fifth modification example is capable of achieving effects similar to those achieved by the embodiment described above. In addition, the planar-direction size can become compact because the opening area of the mold through hole 41 can become smaller than in the electronic device 100. A conductive portion may be disposed in the circuit board 10 as in the case of the first modification example.

Shapes according to the sixth to ninth modification examples, which will be described below, can also be adopted for the substrate through hole 11.

Sixth Modification Example

Figure 25:
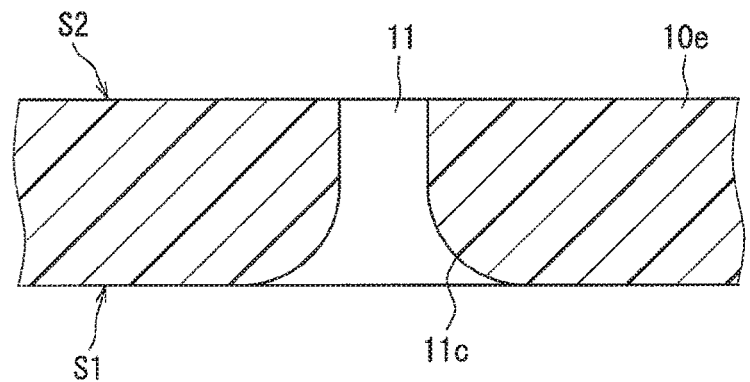
FIG. 25 is a cross-sectional view illustrating a schematic configuration of a circuit board according to a sixth modification example.

An electronic device according to the sixth modification example has a circuit board 10e. As illustrated in FIG. 25, a resin inclined portion 11c as a substrate inclined portion is disposed in the circuit board 10e. In the electronic device according to the sixth modification example, the mold resin 40 is provided on the surface S1 of the circuit board 10e as in the case of the electronic device 100.

This resin inclined portion 11c is inclined in the shape of a curved surface. It can be said that the resin inclined portion 11c that has the shape of a convex surface is disposed in the circuit board 10e. By a pin that differs in shape from the pin 460 being used, the electronic device according to the sixth modification example can be manufactured by a method similar to the method for manufacturing the electronic device 100.

The sixth modification example is capable of achieving effects similar to those achieved by the embodiment described above. A conductive portion may be disposed in the circuit board 10e as in the case of the first modification example. In this case, the conductive portion includes a part that is inclined along the resin inclined portion 11c.

Seventh Modification Example

Figure 26:
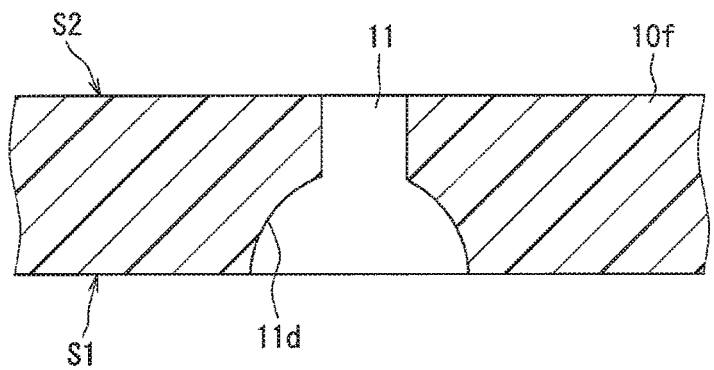
FIG. 26 is a cross-sectional view illustrating a schematic configuration of a circuit board according to a seventh modification example.

An electronic device according to the seventh modification example has a circuit board 10f. As illustrated in FIG. 26, a resin inclined portion 11d as a substrate inclined portion is disposed in the circuit board 10f. In the electronic device according to the seventh modification example, the mold resin 40 is provided on the surface S1 of the circuit board 10f as in the case of the electronic device 100.

This resin inclined portion 11d is inclined in the shape of a curved surface. It can be said that the resin inclined portion 11d that has the shape of a concave surface is disposed in the circuit board 10f. By a pin that differs in shape from the pin 460 being used, the electronic device according to the seventh modification example can be manufactured by a method similar to the method for manufacturing the electronic device 100.

The seventh modification example is capable of achieving effects similar to those achieved by the embodiment described above. A conductive portion may be disposed in the circuit board 10f as in the case of the first modification example. In this case, the conductive portion includes a part that is inclined along the resin inclined portion 11d.

Eighth Modification Example

Figure 27:
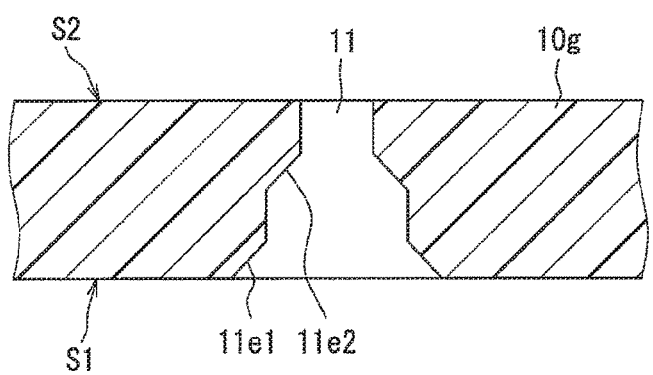
FIG. 27 is a cross-sectional view illustrating a schematic configuration of a circuit board according to an eighth modification example.

An electronic device according to the eighth modification example has a circuit board 10g. As illustrated in FIG. 27, a first resin inclined portion 11e1 and a second resin inclined portion 11e2 as substrate inclined portions are disposed in the circuit board 10g. By a pin that differs in shape from the pin 460 being used, the electronic device according to the eighth modification example can be manufactured by a method similar to the method for manufacturing the electronic device 100. In the electronic device according to the eighth modification example, the mold resin 40 is provided on the surface S1 of the circuit board 10g as in the case of the electronic device 100.

The eighth modification example is capable of achieving effects similar to those achieved by the embodiment described above. A conductive portion may be disposed in the circuit board 10g as in the case of the first modification example. In this case, the conductive portion includes a part that is inclined along the first resin inclined portion 11e1 and the second resin inclined portion 11e2.

Ninth Modification Example

Figure 28:
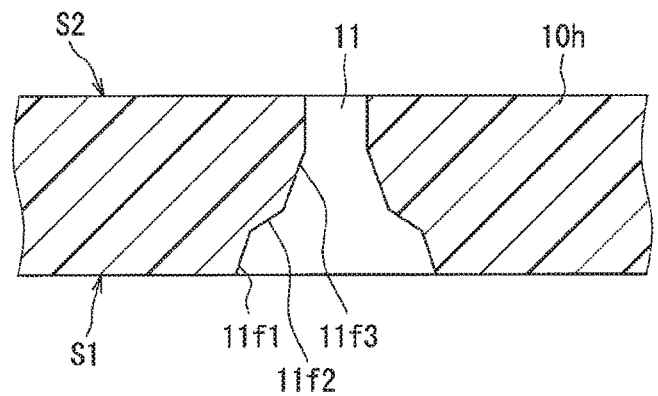
FIG. 28 is a cross-sectional view illustrating a schematic configuration of a circuit board according to a ninth modification example.

An electronic device according to the ninth modification example has a circuit board 10h. As illustrated in FIG. 28, a first resin inclined portion 11f1, a second resin inclined portion 11f2, and a third resin inclined portion 11f3 as substrate inclined portions are disposed in the circuit board 10h. By a pin that differs in shape from the pin 460 being used, the electronic device according to the ninth modification example can be manufactured by a method similar to the method for manufacturing the electronic device 100. In the electronic device according to the ninth modification example, the mold resin 40 is provided on the surface S1 of the circuit board 10h as in the case of the electronic device 100.

The ninth modification example is capable of achieving effects similar to those achieved by the embodiment described above. A conductive portion may be disposed in the circuit board 10h as in the case of the first modification example. In this case, the conductive portion includes a part that is inclined along the first resin inclined portion 11f1, the second resin inclined portion 11f2, and the third resin inclined portion 11f3.

Tenth Modification Example

Figure 29:
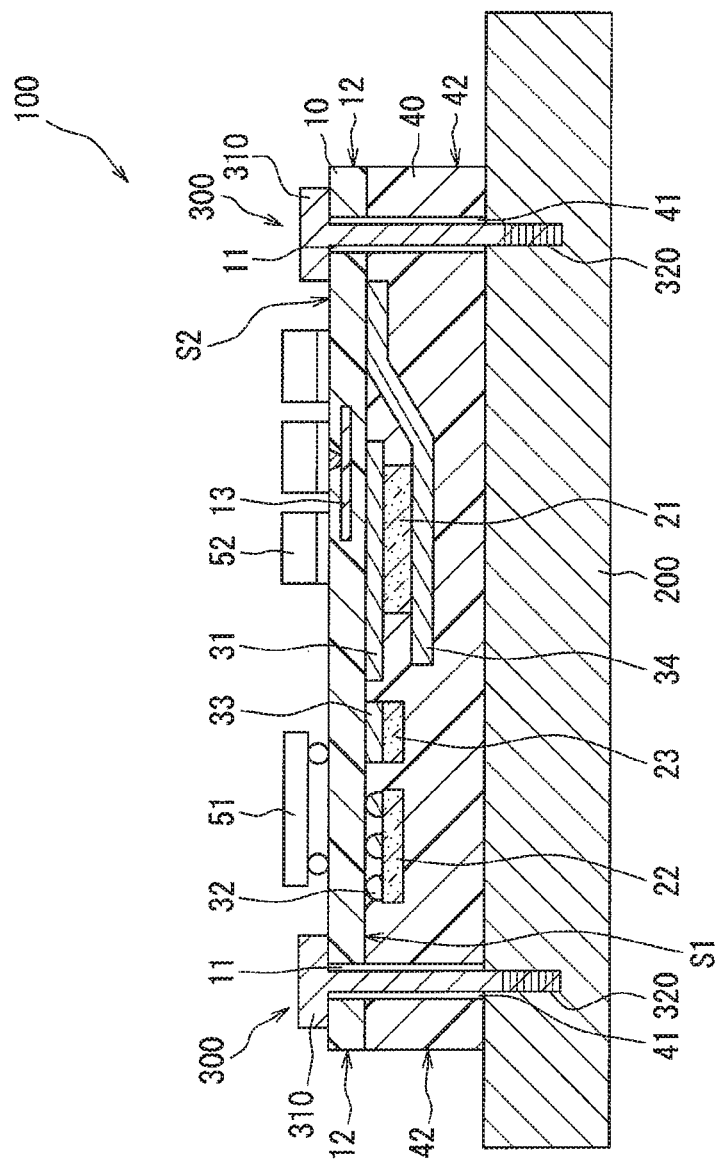
FIG. 29 is a cross-sectional view illustrating a schematic configuration of an electronic device according to a tenth modification example.

In an electronic device 110 according to the tenth modification example, out-mold elements 51 and 52 as circuit elements are mounted on the reverse surface S2 of a circuit board 10i as illustrated in FIG. 29. These out-mold elements 51 and 52, which are capacitors, coils, or the like, are electrically and mechanically connected to the land of the circuit board 10 via a conductive connection member such as a solder. In addition, the out-mold elements 51 and 52 are electrically connected to the wiring 13 via the conductive connection member and the land. In this manner, the electronic device 110 has the circuit board 10i that is a resin substrate which allows double-sided mounting to be performed. Since the electronic device 110 has the circuit board 10i that is a double-sided mounting substrate, the electronic device 110 can become more compact in size than in a case where a single-sided mounting substrate is adopted. The size mentioned herein means dimensions in the planar direction that is orthogonal to the thickness direction of the electronic device 100.

As illustrated in FIG. 29, this electronic device 110 is attached to the metal base 200 in a state where the mold resin 40 faces the metal base 200. More specifically, the electronic device 110 is attached to the metal base 200 in a state where the mold resin 40 is in contact with the metal base 200. This facilitates the attachment of the electronic device 110 to the metal base 200 even when the electronic device 110 has the circuit board 10*i* that has the reverse surface S2 on which the out-mold elements 51 and 52 are mounted. This electronic device 110 can be manufactured by a method similar to the method for manufacturing the electronic device 100. The electronic device 110 may be attached to the metal base 200 via a heat conductive member such as thermal grease between the mold resin 40 and the metal base 200.

The tenth modification example is capable of achieving effects similar to those achieved by the embodiment described above. The present disclosure can also be carried out with the tenth modification example combined with at least one of the first to ninth modification examples.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A method for manufacturing an electronic device including: a circuit board in which a wiring is arranged on a resin base; a circuit element mounted on one surface of the circuit board; a resin mold disposed on the one surface of the circuit board and sealing the circuit element; a substrate through hole penetrating the circuit board in a thickness direction; and a mold through hole communicating with the substrate through hole and penetrating the resin mold in the thickness direction, the method for manufacturing the electronic device using: a first mold to which the circuit board is fixed; a second mold having a recessed cavity in which a constituent material of the resin mold is arranged; and a pressing member disposed to protrude from a bottom surface of the recessed cavity and pressing the circuit board, the method for manufacturing the electronic device comprising:
fixing the circuit board, on which the circuit element is mounted, to the first mold;
covering an opening of the substrate through hole on the one surface by pressing the pressing member against the circuit board from the one surface; and
forming the resin mold by hardening the constituent material while covering the one surface and the circuit element with the constituent material in the recessed cavity in a state where the second mold is fixed to the one surface or the first mold in such a manner that the recessed cavity faces the one surface, and the opening is covered by the pressing member to seal the recessed cavity, wherein:
the covering of the opening includes press-contacting the pressing member to the circuit board in a state where a part of the pressing member is inserted into the substrate through hole, and the opening is covered in a state where the circuit board is deformed to have a tilted shape in such a manner that an opening area of the substrate through hole decreases toward a reverse surface from an open end on the one surface.

2. The method for manufacturing the electronic device according to claim 1, wherein:
the pressing member includes: a columnar portion protruding from the bottom surface; and a chevron portion disposed on a top of the columnar portion opposite to the bottom surface and having a diameter decreasing as a distance from the bottom surface increases;
the covering of the opening includes press-contacting the chevron portion to the circuit board in a state where at least a part of the chevron portion is inserted into the substrate through hole, and the circuit board is deformed to have the tilted shape.

3. The method for manufacturing an electronic device according to claim 2, wherein:
in the covering of the opening, the opening is covered in a state where a whole of the chevron portion is inserted into the substrate through hole, and a boundary between the columnar portion and the chevron portion is arranged on a virtual plane in parallel to the one surface.

4. The method for manufacturing an electronic device according to claim 1, wherein:
the substrate through hole is a through hole penetrating the resin base in the thickness direction; and
the covering of the opening includes deforming the resin base.

5. The method for manufacturing an electronic device according to claim 1, wherein:
the substrate through hole is disposed in a conductive member which is arranged on an inner wall of a through hole penetrating the resin base in the thickness direction; and
the covering of the opening includes deforming the resin base and the conductive member.

6. The method for manufacturing an electronic device according to claim 1, wherein:
the first mold and the second mold are a pair of molds as a part of a compression molding machine; and
the forming of the resin mold includes forming the resin mold by a compression mold method.

7. An electronic device comprising:
a circuit board in which a wiring is arranged on a resin base;
a circuit element mounted on one surface of the circuit board; and
a resin mold disposed on the one surface of the circuit board and sealing the circuit element, wherein:
the circuit board includes: a substrate through hole penetrating the circuit board in a thickness direction of the circuit board; and a substrate inclined portion having a tilted shape that an opening area of the substrate through hole decreases toward a reverse surface from an open end on the one surface, the reverse surface being opposite to the one surface;
the resin mold includes a mold through hole penetrating the resin mold in a thickness direction of the resin mold and communicating with the substrate through hole;
the substrate inclined portion is a deformation portion deformed by a pressing member for covering the substrate through hole and for providing the mold through hole in a resin mold formation;
the resin mold includes a mold inclined portion having a tilted shape that an opening area of the mold through hole increases toward a reverse surface of the resin mold from an open end on the one surface, the reverse surface being opposite to the one surface; and
a surface of the substrate inclined portion and a surface of the mold inclined portion are arranged on a same plane.

8. The electronic device according to claim 7, wherein:
the substrate inclined portion is a part of the resin base.

9. The electronic device according to claim 7, wherein:
the substrate through hole is disposed in a conductive member which is arranged on an inner wall of a through hole penetrating the resin base in the thickness direction; and
the substrate inclined portion includes a part of the conductive member.

10. The electronic device according to claim 7, wherein:
an opening area of the mold through hole is equal to the opening area of the substrate through hole on the open end of the one surface.

* * * * *